(12) United States Patent
Kim

(10) Patent No.: US 10,210,998 B2
(45) Date of Patent: Feb. 19, 2019

(54) PHOTOELECTRIC CONVERSION DEVICE AND IMAGING DEVICE INCLUDING THE SAME

(71) Applicant: Samsung Electronics Co., Ltd., Suwon-si, Gyeonggi-do (KR)

(72) Inventor: Yongchul Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/449,100

(22) Filed: Mar. 3, 2017

(65) Prior Publication Data
US 2018/0096795 A1 Apr. 5, 2018

(30) Foreign Application Priority Data
Oct. 4, 2016 (KR) .................. 10-2016-0127548

(51) Int. Cl.
*H01G 9/20* (2006.01)
*H01L 51/42* (2006.01)
*H01L 27/30* (2006.01)
*H01L 51/00* (2006.01)

(52) U.S. Cl.
CPC ......... *H01G 9/2009* (2013.01); *H01L 27/307* (2013.01); *H01L 51/0077* (2013.01); *H01L 51/4213* (2013.01)

(58) Field of Classification Search
None
See application file for complete search history.

(56) References Cited

U.S. PATENT DOCUMENTS

| | | | |
|---|---|---|---|
| 9,293,721 B2 | 3/2016 | Kasama et al. | |
| 2014/0230900 A1* | 8/2014 | Cull | H01L 51/0007 136/263 |
| 2014/0332078 A1 | 11/2014 | Guo et al. | |
| 2016/0111575 A1 | 4/2016 | Han et al. | |
| 2016/0343965 A1* | 11/2016 | Marks | H01L 51/4213 |
| 2017/0250030 A1* | 8/2017 | Druffel | H01G 9/2009 |

FOREIGN PATENT DOCUMENTS

| | | |
|---|---|---|
| JP | 5703457 B2 | 4/2015 |
| KR | 20150122598 A | 11/2015 |

OTHER PUBLICATIONS

Sergi Yakunin et al., "Detection of X-ray Photons by Solution-processed Lead Halide Perovskites", Nature Photonics, vol. 9, pp. 444-450.
Hyun Suk Jung et al., Perovskite Solar Cells: From Materials to Devices, Small, 2015, vol. 11, Issue 1 Jan. 7, 2015 pp. 10-25.
Zhipeng Lian et al., High-Performance Planar-Type Phiotodetector on (100) Facet of MAPI3 Single Crystal, Scientific Reports 5, 16563 (2015).
Ying, Chin et al., "Direct Insight Into Crystallization and Stability of Hybrid Perovskite CH3NH3PbI3 via Solvothermal Synthesis", J. Mater. Chem. A, 2015, 3, 15854.

* cited by examiner

*Primary Examiner* — Mounir S Amer
(74) *Attorney, Agent, or Firm* — Harness, Dickey & Pierce, P.L.C.

(57) ABSTRACT

Example embodiments relate to a photoelectric conversion device, and to an imaging device including the photoelectric conversion device.

18 Claims, 13 Drawing Sheets

—710

—720
—710

—740
—720
—710

PHOTOELECTRIC CONVERSION DEVICE AND IMAGING DEVICE INCLUDING THE SAME

CROSS-REFERENCE TO RELATED APPLICATION

This application claims the benefit of priority from Korean Patent Application No. 10-2016-0127548, filed on Oct. 4, 2016, in the Korean Intellectual Property Office, the disclosure of which is incorporated herein in its entirety by reference.

BACKGROUND

1. Field

Some example embodiments relate to a photoelectric conversion device and an imaging device including the same.

2. Description of the Related Art

A photoelectric conversion device refers to a device which converts an optical signal into an electrical signal. In general, a photoelectric conversion device uses, for example, a photoconductive effect and a photovoltaic effect for converting an optical signal to an electrical signal.

For example, such a photoelectric conversion device may be used in an imaging device. The imaging device may include photoelectric conversion devices arranged two-dimensionally on transistors, and collect electrical signals generated from the photoelectric conversion devices.

SUMMARY

Some example embodiments relate to a photoelectric conversion device and an imaging device including the same, and/or to a photoelectric conversion device including a perovskite compound, and an imaging device including the photoelectric conversion device.

Additional example embodiments will be set forth in part in the description which follows and, in part, will be apparent from the description, or may be learned by practice of the example embodiments.

According to an example embodiment, a photoelectric conversion device includes a first conductive layer, a second conductive layer, and a photoelectric conversion layer and a hole blocking layer between the first conductive layer and the second conductive layer, wherein the hole blocking layer is between the second conductive layer and the photoelectric conversion layer and includes a first perovskite compound represented by Formula 1:

$$[A^1][B^1][X^1_{(3-n)}Y^1_n] \qquad \text{<Formula 1>}$$

wherein, in Formula 1,
$A^1$ is at least one monovalent organic cation, at least one monovalent inorganic cation, or any combination thereof,
$B^1$ is at least one divalent inorganic cation,
$X^1$ and $Y^1$ are each independently at least one monovalent anion, and n is a real number satisfying $0 \leq n \leq 3$.

According to an example embodiment, a photoelectric conversion device includes a first conductive layer, a second conductive layer, and a photoelectric conversion layer between the first conductive layer and the second conductive layer, wherein the photoelectric conversion layer includes a second perovskite compound represented by Formula 2, and the second perovskite compound is polycrystalline:

$$[A^2][B^2][X^2_{(3-m)}Y^2_m] \qquad \text{<Formula 2>}$$

wherein, in Formula 2,
$A^2$ is at least one monovalent organic cation, a monovalent inorganic cation, or any combination thereof,
$B^2$ is at least one divalent inorganic cation,
$X^2$ and $Y^2$ are each independently at least one monovalent anion, and m is a real number satisfying $0 \leq m \leq 3$.

According to an example embodiment, an imaging device includes a light irradiation unit, a photodetector unit, and a control unit, the photodetector unit including the above-described photoelectric conversion device.

BRIEF DESCRIPTION OF THE DRAWINGS

These and/or other example embodiments will become apparent and more readily appreciated from the following description taken in conjunction with the accompanying drawings in which.

DETAILED DESCRIPTION

Figure 1:
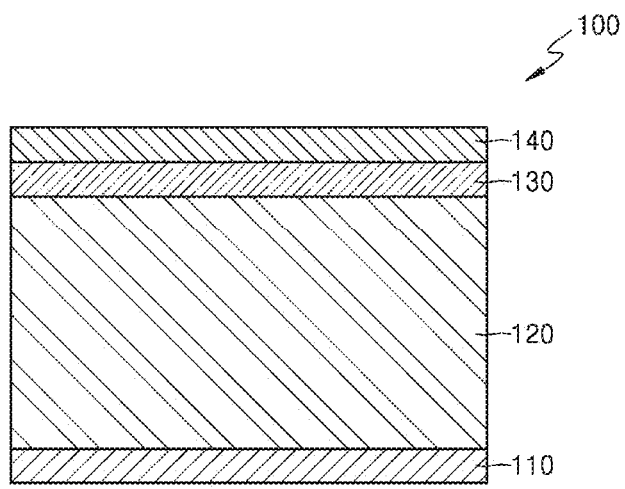
FIG. 1 is a schematic cross-sectional side view of a photoelectric conversion device according to an example embodiment.

Reference will now be made in detail to example embodiments of a photoelectric conversion device, an example method of operating the photoelectric conversion device, and an example method of manufacturing the photoelectric conversion device, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. In the drawings, like reference numerals denote like elements throughout, and thus redundant description thereof will be omitted. In the drawings, the sizes of elements are exaggerated or reduced for ease of description. As used herein, the term "and/or" includes any and all combinations of one or more of the associated listed items. Expressions such as "at least one of," when preceding a list of elements, modify the entire list of elements and do not modify the individual elements of the list.

It will also be understood that when an element such as a layer, a region, or a component is referred to as being "on" another layer or element, it can be "directly on" the other layer or element, or intervening layers, regions, or components may also be present.

Although the terms "first", "second", etc., may be used herein to describe various elements, components, regions, and/or layers, these elements, components, regions, and/or layers should not be limited by these terms. These terms are used only to distinguish one component from another, not for purposes of limitation.

General and widely used terms have been employed herein, in consideration of functions provided in the present disclosure, and may vary according to an intention of one of ordinary skill in the art, a precedent, or emergence of new technologies. Additionally, in some cases, an applicant may arbitrarily select specific terms. Then, the applicant will provide the meaning of the terms in the description of the present disclosure. Accordingly, it will be understood that the terms used herein should be interpreted as having a meaning that is consistent with their meaning in the context of the relevant art and will not be interpreted in an idealized or overly formal sense unless expressly so defined herein As used herein, the term "perovskite compound" refers to a compound represented by, for example, the formula of $ABX_3$, wherein A and B are cations having different sizes, and X is an anion. In the unit cell of the perovskite compound, a site of the cation A may be, for example, at (0,0,0), a site of the cation B may be, for example, at (½,½,½), and a site of the anion X may be, for example, at (½,½,0). The perovskite compound may have a twisted structure with lower symmetry, compared to the ideal symmetric structure of calcium titanium oxide ($CaTiO_3$), depending on types of A, B, and X. It will be understood that the perovskite compound used herein may encompass a compound having the ideal symmetric structure and a compound having a twisted structure with low symmetry.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

FIG. 1 is a schematic cross-sectional side view of a photoelectric conversion device 100 according to an example embodiment.

Referring to FIG. 1, the photoelectric conversion device 100 may include a first conductive layer 110, a second conductive layer 140, a photoelectric conversion layer 120, and a hole blocking layer 130.

The photoelectric conversion layer 120 and the hole blocking layer 130 may be between the first conductive layer 110 and the second conductive layer 140.

The hole blocking layer 130 may be between the second conductive layer 140 and the photoelectric conversion layer 120.

The hole blocking layer 130 may include a first perovskite compound represented by Formula 1:

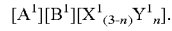          <Formula 1>

In Formula 1, $A^1$ may be, for example, at least one monovalent organic cation, at least one monovalent inorganic cation, or any combination thereof.

For example, in Formula 1, $A^1$ may be i) a monovalent organic cation, ii) a monovalent inorganic cation, iii) at least two different monovalent organic cations, iv) at least two different monovalent inorganic cations, or v) any combination of at least one monovalent organic cation and at least one monovalent inorganic cation. However, example embodiments are not limited thereto.

In some example embodiments, in Formula 1, $A^1$ may be $(R_1R_2R_3C)^+$, $(R_1R_2R_3R_4N)^+$, $(R_1R_2R_3R_4P)^+$, $(R_1R_2R_3R_4As)^+$, $(R_1R_2R_3R_4Sb)^+$, $(R_1R_2N=C(R_3)-NR_4R_5)^+$, a substituted or unsubstituted nitrogen-containing 5-membered cyclic monovalent cation, a substituted or unsubstituted nitrogen-containing 6-membered cyclic monovalent cation, a substituted or unsubstituted 7-membered cyclic monovalent cation, $Li^+$, $Na^+$, $K^+$, $Rb^+$, $Cs^+$, $Fr^+$, or any combination thereof. $R_1$ to $R_5$, at least one substituent of the substituted nitrogen-containing 5-membered cyclic monovalent cation, at least one substituent of the substituted nitrogen-containing 6-membered cyclic monovalent cation, and at least one substituent of the substituted 7-membered cyclic monovalent cation may be each independently selected from, or include, hydrogen, deuterium (-D), —F, —Cl, —Br, —I, a hydroxyl group, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_6$-$C_{20}$ aryl group, and —$N(Q_1)(Q_2)$. $Q_1$ and $Q_2$ may be each independently selected from, or include, hydrogen, deuterium, a hydroxyl group, a $C_1$-$C_{20}$ alkyl group, a $C_2$-$C_{20}$ alkenyl group, a $C_2$-$C_{20}$ alkynyl group, a $C_1$-$C_{20}$ alkoxy group, and a $C_6$-$C_{20}$ aryl group. However, embodiments are not limited thereto.

In some other example embodiments, in Formula 1, $A^1$ may be $(R_1R_2R_3C)^+$, $(R_1R_2R_3R_4N)^+$, $(R_1R_2R_3R_4P)^+$, $(R_1R_2R_3R_4As)^+$, $(R_1R_2R_3R_4Sb)^+$, $(R_1R_2N=C(R_3)-NR_4R_5)^+$, a substituted or unsubstituted cycloheptatrienium, a substituted or unsubstituted imidazolium, a substituted or unsubstituted pyridinium, a substituted or unsubstituted pyridazinium, a substituted or unsubstituted pyrimidinium, a substituted or unsubstituted pyrazinium, a substituted or unsubstituted pyrazolium, a substituted or unsubstituted thiazolium, a substituted or unsubstituted oxazolium, a substituted or unsubstituted piperidinium, a substituted or unsubstituted pyrrolidinium, a substituted or unsubstituted pyrrolinium, a substituted or unsubstituted pyrrolium, a substituted or unsubstituted triazolium, $Li^+$, $Na^+$, $K^+$, $Rb^+$, $Cs^+$, $Fr^+$, or any combination thereof. $R_1$ to $R_5$, at least one substituent of the substituted imidazolium, at least one substituent of the substituted pyridinium, at least one substituent of the substituted pyridazinium, at least one substituent of the substituted pyrimidinium, at least one substituent of the substituted pyrazinium, at least one substituent of the substituted pyrazolium, at least one substituent of the substituted thiazolium, at least one substituent of the substituted oxazolium, at least one substituent of the substituted piperidinium, at least one substituent of the substituted pyrrolidinium, at least one substituent of the substituted pyrrolinium, at least one substituent of the substituted pyrrolium, and at least one substituent of the substituted triazolium may be each independently selected from, or include, hydrogen, deuterium, —F, —Cl, —Br, —I, a hydroxyl group, a $C_1$-$C_{20}$ alkyl group, a $C_2$-$C_{10}$ alkenyl group, a $C_2$-$C_{10}$ alkynyl group, and a $C_1$-$C_{20}$ alkoxy group; a $C_1$-$C_{20}$ alkyl group, a $C_2$-$C_{10}$ alkenyl group, a $C_2$-$C_{10}$ alkynyl group, and a $C_1$-$C_{20}$ alkoxy group, each substituted with at least one selected from, or include, deuterium, —F, —Cl, —Br, —I, and a hydroxyl group; a phenyl group, a naphthyl group, a biphenyl group, and a terphenyl group, a phenyl group, a naphthyl group, a biphenyl group, and a terphenyl group, each substituted with at least one selected from, or include, deuterium, —F, —Cl, —Br, —I, a hydroxyl group, a $C_1$-$C_{20}$ alkyl group, a $C_2$-$C_{10}$ alkenyl group, a $C_2$-$C_{10}$ alkynyl group, and a $C_1$-$C_{20}$ alkoxy group, and —N($Q_1$)($Q_2$). $Q_1$ and $Q_2$ may each independently be selected from, or include, hydrogen, deuterium, a $C_1$-$C_{20}$ alkyl group, a $C_2$-$C_{10}$ alkenyl group, a $C_2$-$C_{10}$ alkynyl group, a $C_1$-$C_{20}$ alkoxy group, a phenyl group, a naphthyl group, a biphenyl group, and a terphenyl group. However, example embodiments are not limited thereto.

In some other example embodiments, in Formula 1, $A^1$ may be $(R_1R_2R_3R_4N)^+$, $(R_1R_2R_3R_4P)^+$, $(R_1R_2R_3R_4As)^+$, $(R_1R_2R_3R_4Sb)^+$, $(R_1R_2N=C(R_3)-NR_4R_5)^+$, a substituted or unsubstituted cycloheptatrienium, $Li^+$, $Na^+$, $K^+$, $Rb^+$, $Cs^+$, $Fr^+$, or any combination thereof. $R_1$ to $R_4$, and at least one substituent of the substituted cycloheptatrienium may each independently be selected from, or include, hydrogen, deuterium, —F, —Cl, —Br, —I, a hydroxyl group, a $C_1$-$C_{20}$ alkyl group, a $C_2$-$C_{10}$ alkenyl group, a $C_2$-$C_{10}$ alkynyl group, a $C_1$-$C_{20}$ alkoxy group, and —N($Q_1$)($Q_2$); and $Q_1$ and $Q_2$ may each independently be selected from, or include, hydrogen, deuterium, a $C_1$-$C_{20}$ alkyl group, a $C_2$-$C_{10}$ alkenyl group, a $C_2$-$C_{10}$ alkynyl group, and a $C_1$-$C_{20}$ alkoxy group. However, embodiments are not limited thereto.

In some example embodiments, in Formula 1, $A^1$ may be $(CH_3NH_3)^+$, $(C_2H_6PH_2)^+$, $(CH_3AsH_3)^+$, $(NH_4)^+$, $(CH_3SbH_3)^+$, $(C_2H_6NH_2)^+$, $(PH_4)^+$, $(CH_2N_2H_4)^+$, $(PF_4)^+$, $(CH_3PH_3)^+$, $(C_7H_7)^+$, $(SbH_4)^+$, $(AsH_4)^+$, $(NCl_4)^+$, $(NH_3OH)^+$, $(NH_3NH_2)^+$, $(CH(NH_2)_2)^+$, $(C_3N_2H_5)^+$, $((CH_3)_2NH_2)^+$, $(NC_4H_8)^+$, $((CH_3CH_2)NH_3)^+$, $((NH_2)_3C)^+$, $((CH_3CH_2CH_2CH_2)NH_3)^+$, $(NH_2CHNH_2)^+$, $Li^+$, $Na^+$, $K^+$, $Rb^+$, $Cs^+$, $Fr^+$, or any combination thereof. However, example embodiments are not limited thereto.

In some example embodiments, in Formula 1, $A^1$ may be $(CH_3NH_3)^+$, $((CH_3CH_2CH_2CH_2)NH_3)^+$, $(NH_2CHNH_2)^+$, $K^+$, $Rb^+$, $Cs^+$, or any combination thereof. However, example embodiments are not limited thereto.

In Formula 1, $B^1$ may be at least one divalent inorganic cation.

For example, in Formula 1, $B^1$ may be i) a divalent inorganic cation, or ii) a combination of at least two different divalent inorganic cations. However, example embodiments are not limited thereto.

In some example embodiments, in Formula 1, $B^1$ may be a divalent cation of a rare earth metal, a divalent cation of an alkali earth metal, a divalent cation of a transition metal, a divalent cation of a late transition metal, or any combination thereof. However, example embodiments are not limited thereto.

In some other example embodiments, in Formula 1, $B^1$ may be $La^{2+}$, $Ce^{2+}$, $Pr^{2+}$, $Nd^{2+}$, $Pm^{2+}$, $Sm^{2+}$, $Eu^{2+}$, $Gd^{2+}$, $Tb^{2+}$, $Dy^{2+}$, $Ho^{2+}$, $Er^{2+}$, $Tm^{2+}$, $Yb^{2+}$, $Lu^{2+}$, $Be^{2+}$, $Mg^{2+}$, $Ca^{2+}$, $Sr^{2+}$, $Ba^{2+}$, $Ra^{2+}$, $Pb^{2+}$, $Sn^{2+}$, or any combination thereof. However, example embodiments are not limited thereto.

In some other example embodiments, in Formula 1, $B^1$ may be $Pb^{2+}$, $Sn^{2+}$, or any combination thereof. However, example embodiments are not limited thereto.

In some other example embodiments, in Formula 1, $B^1$ may be $Pb^{2+}$. However, example embodiments are not limited thereto.

For example, in Formula 1, $X^1$ and $Y^1$ may each independently be at least one monovalent anion, wherein $X^1$ and $Y^1$ may be the same as or different from each other.

For example, in Formula 1, $X^1$ and $Y^1$ may each independently be i) a monovalent anion, or ii) any combination of at least two different monovalent anions. However, example embodiments are not limited thereto.

In some example embodiments, in Formula 1, $X^1$ and $Y^1$ may each independently be at least one halide anion. However, example embodiments are not limited thereto.

In some example embodiments, in Formula 1, $X^1$ and $Y^1$ may each independently be selected from, or include, $Cl^-$, $Br^-$, and $I^-$. However, example embodiments are not limited thereto.

In Formula 1, n may be a real number satisfying $0 \leq n \leq 3$.

For example, in Formula 1, n may be a real number satisfying $0 \leq n < 3$. However, example embodiments are not limited thereto.

In some example embodiments, the first perovskite compound represented by Formula 1 may be selected from, or include, $CH_3NH_3PbBr_3$, $CH_3NH_3PbBr_{(3-o)}I_o$, $CH_3NH_3PbCl_{(3-o)}Br_o$, $CH_3NH_3PbCl_{(3-o)}I_o$, $CsPbI_3$, $CsPbBr_3$, $CH_3CH_2CH_2CH_2NH_3PbBr_3$, $NH_2CHNH_2PbBr_3$, $NH_2CHNH_2PbBr_{(3-o)}I_o$, $[CH_3NH_3]_{(1-x)}[NH_2CHNH_2]_xPbBr_3$, and $[CH_3NH_3]_{(1-x)}[NH_2CHNH_2]PbBr_{(3-o)}I_o$, wherein o may be a real number greater than 0 and less than 3, and x may be a real number greater than 0 and less than 1. However, example embodiments are not limited thereto.

In some example embodiments, the hole blocking layer 130 may have a thickness of about 1 nm to about 10 μm. For example, the hole blocking layer 130 may have a thickness of about 10 nm to about 10 μm, and in some example embodiments, about 50 nm to about 5000 nm. However, example embodiments are not limited thereto. When the thickness of the hole blocking layer 130 is within the above ranges, the photoelectric conversion device may have a sufficient dark current reduction effect and a photoelectric conversion efficiency that is maintained at a similar level or is slightly reduced.

The hole blocking layer 130 may be formed as described below.

The first conductive layer 110 and the second conductive layer 140 may be reflective, transmissive, or semi-transmissive depending on a use.

The first conductive layer 110 and the second conductive layer 140 may include a conductive material(s), for example, a metal, a metal oxide, an electrically conductive organic compound, or a combination thereof. For example, when the first conductive layer 110 is transmissive, a material for forming the first conductive layer 110 may be selected from or include indium tin oxide (ITO), indium zinc oxide (IZO), tin oxide ($SnO_2$), zinc oxide (ZnO), and any combination thereof. However, example embodiments are not limited thereto. For example, when the first conductive layer 110 is semi-transmissive or reflective, a material for forming the first conductive layer 110 may be selected from, or include, gold (Au), silver (Ag), chromium (Cr), nickel (Ni), and any combination thereof. However, example embodiments are not limited thereto. The above-listed materials for forming the first conductive layer 110 may be used as materials for forming the second conductive layer 140, and thus a detailed description of the second conductive layer 140 will be omitted here.

In some example embodiments, when light is provided as X-rays, the second conductive layer 140 may be reflective, transmissive, or semi-transmissive.

In some example embodiments, when light is provided as infrared rays or visible rays, the second conductive layer 140 may be transmissive. The second conductive layer 140 may be transmissive enough to allow light to enter the photoelectric conversion device through the second conductive layer 140.

The first conductive layer 110 and the second conductive layer 140 may have any thickness, for example, a thickness of about 10 nm to about 2000 nm. However, example embodiments are not limited thereto.

Methods of forming the first conductive layer 110 and the second conductive layer 140 are not specifically limited, and may include a variety of example methods, including coating, deposition, and the like.

The photoelectric conversion layer 120 may include a semiconductor material as a photoactive material, for example, amorphous Se, CdZnTe, GaAs, InP, Si, or any combination thereof. However, example embodiments are not limited thereto.

In some example embodiments, the photoelectric conversion layer 120 may include a second perovskite compound represented by Formula 2, which will be described later, as the photoactive material. However, example embodiments are not limited thereto.

The photoelectric conversion layer 120 may absorb light, for example, infrared rays, visible rays, or X-rays. In some example embodiments, the photoelectric conversion layer 120 may absorb X-rays.

The photoelectric conversion layer 120 may have a thickness of about 0.1 μm to about 2,000 μm. When the thickness of the photoelectric conversion layer 120 is within this range, efficiency of photoelectric conversion of infrared rays, visible rays, and even light having a short wavelength, such as X-rays, may be improved.

In some example embodiments, when light is provided as visible rays or infrared rays, the photoelectric conversion layer 120 may have a thickness of about 0.1 μm to about 1 μm. However, example embodiments are not limited thereto.

In some other example embodiments, when light is provided as X-rays, the photoelectric conversion layer 120 may have a thickness of about 100 μm to about 2000 μm. However, example embodiments are not limited thereto.

A method of forming the photoelectric conversion layer 120 is not specifically limited, and any of a variety of methods, including a solution process such as coating or deposition may be used.

Figure 2A:
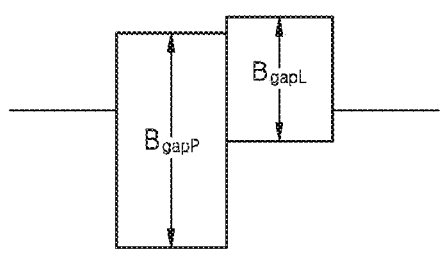
FIGS. 2A and 2B are schematic illustrations of energy levels of a photoactive material included in a photoelectric conversion layer, and a first perovskite compound included in a hole blocking layer.
Figure 2B:
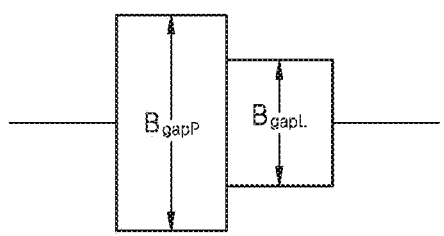

FIGS. 2A and 2B are schematic illustrations of energy levels of the photoactive material included in the photoelectric conversion layer 120, and the first perovskite compound included in the hole blocking layer 130.

Referring to FIGS. 2A and 2B, a band gap ($B_{gapL}$) of the photoactive material may be smaller than a band gap ($B_{gapP}$) of the first perovskite compound. Generally, when an external voltage is applied to the photoelectric conversion device, hole and electron injection may occur, leading to an increased dark current. However, when the condition of $B_{gapL} < B_{gapP}$ is satisfied, a dark current reduction effect may be obtained.

For example, the band gap $B_{gapP}$ of the first perovskite compound may be from about 1.56 eV to about 9.00 eV.

For example, the band gap $B_{gapL}$ of the photoactive material may be from about 1.40 eV to about 3.00 eV.

Referring to FIG. 2A, the lowest unoccupied molecular orbital (LUMO) energy level of the photoactive material may be higher than the LUMO energy level of the first perovskite compound. However, example embodiments are not limited thereto.

Referring to FIG. 2B, the LUMO energy level of the photoactive material may be equal to or lower than the LUMO energy level of the first perovskite compound. However, example embodiments are not limited thereto.

Figure 3:
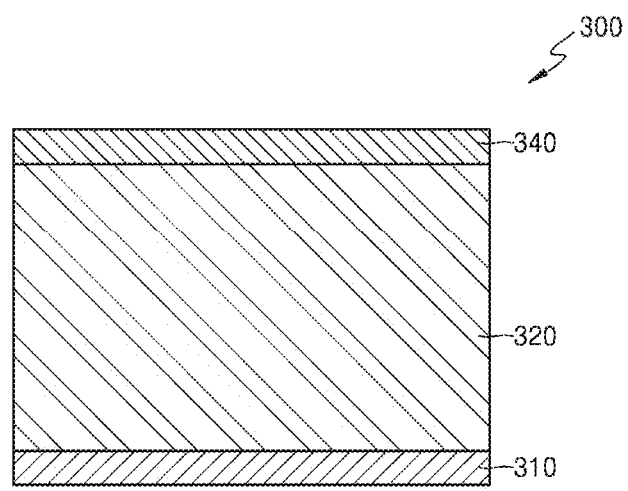
FIG. 3 is a schematic cross-sectional side view of a photoelectric conversion device according to another example embodiment.

FIG. 3 is a schematic cross-sectional side view of a photoelectric conversion device 300 according to another example embodiment.

Referring to FIG. 3, the photoelectric conversion device 300 may include a first conductive layer 310, a second conductive layer 340, and a photoelectric conversion layer 320.

The photoelectric conversion layer 320 may be between the first conductive layer 310 and the second conductive layer 340.

The photoelectric conversion layer 320 may include a second perovskite compound represented by Formula 2:

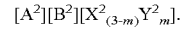    <Formula 2>

In Formula 2, $A^2$ may be at least one monovalent organic cation, at least one monovalent inorganic cation, or any combination thereof, $B^2$ may be at least one divalent inorganic cation, $X^2$ and $Y^2$ may each independently be at least one monovalent anion, and m may be a real number satisfying $0 \leq m \leq 3$.

Figure 13:
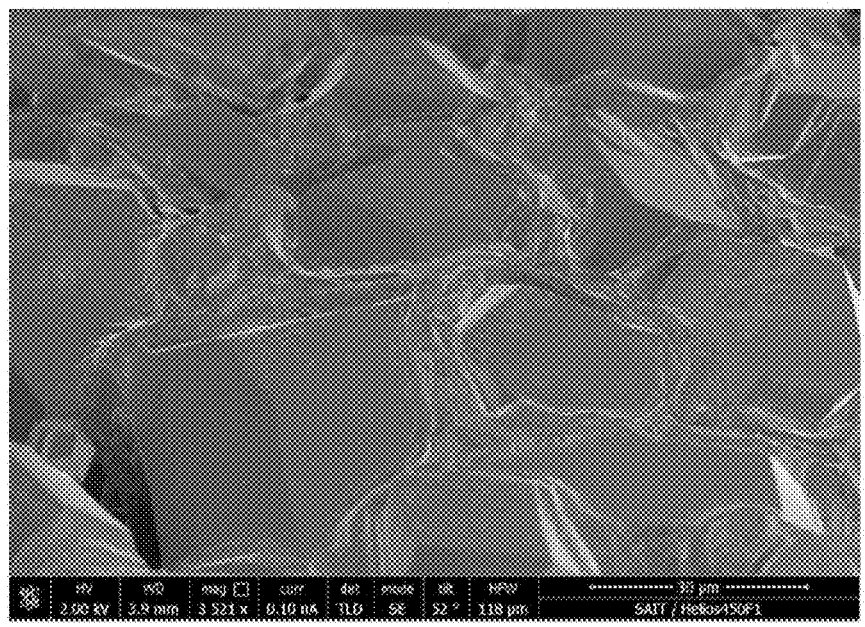
FIG. 13 is a scanning electron microscope (SEM) image of a photoelectric conversion layer of an example photoelectric conversion device.

The second perovskite compound may be polycrystalline. That is, the second perovskite compound may have a structure in which crystals are fused to each other. However, example embodiments are not limited thereto. The photoelectric conversion layer 320 may have a cross-sectional form as illustrated in FIG. 13. However, example embodiments are not limited thereto. When the second perovskite compound is polycrystalline, effects of a dark current reduction and a photoelectric conversion efficiency increase may be provided.

The longest axis of a crystal in the second perovskite compound may be about 1 μm to about 300 μm, and in some example embodiments, about 10 μm to about 50 μm. However, example embodiments are not limited thereto. When the longest axis of a crystal in the second perovskite compound is within these ranges, a photoelectric conversion device with a sufficient dark current reduction effect may be provided without reduction in photoelectric conversion efficiency.

In Formula 2, $A^2$ may be defined substantially the same as $A^1$ in Formula 1 as described above, $B^2$ may be defined substantially the same as $B^1$ in Formula 1 as described above, $X^2$ may be defined substantially the same as $X^1$ in Formula 1 as described above, $Y^2$ may be defined substantially the same as $Y^1$ in Formula 1 as described above, m may be defined substantially the same as n in Formula 1 as described above, and thus detailed descriptions of $A^2$, $B^2$, $X^2$, $Y^2$, and m are not provided.

In some example embodiments, the second perovskite compound represented by Formula 2 may be $CH_3NH_3PbI_3$. However, example embodiments are not limited thereto.

The photoelectric conversion layer 320 may absorb light, for example, infrared rays, visible rays, or X-rays. In some example embodiments, the photoelectric conversion layer 320 may absorb X-rays.

The photoelectric conversion layer 320 may have a thickness of about 0.1 μm to about 2,000 μm. When the thickness of the photoelectric conversion layer 320 is within this range, photoelectric conversion efficiencies of infrared rays, visible rays, and even light having a short wavelength, such as X-rays, may be improved.

In some example embodiments, when the light is provided as visible rays or infrared rays, the photoelectric conversion layer 320 may have a thickness of about 0.1 μm to about 1 μm. However, example embodiments are not limited thereto.

In some other example embodiments, when the light is provided as X-rays, the photoelectric conversion layer 320 may have a thickness of about 100 μm to about 2000 μm. However, example embodiments are not limited thereto.

In some example embodiments, when the light is provided as X-rays, the second conductive layer 340 may be reflective, transmissive, or semi-transmissive.

In some other example embodiments, when the light is provided as infrared rays or visible rays, the second conductive layer 340 may be transmissive. The second conductive layer 340 may be transmissive enough to allow light to enter the photoelectric conversion device through the second conductive layer 340.

The photoelectric conversion device 300 may have any of a variety of forms, for example, a form including a hole blocking layer (not shown). For example, the photoelectric conversion device 300 may further include a hole blocking layer including a first perovskite compound represented by Formula 1. The hole blocking layer may be between the photoelectric conversion layer 320 and the second conductive layer 340.

The above-described descriptions of the first conductive layer 110, the second conductive layer 140, and the photoelectric conversion layer 120 may apply to the first conductive layer 310, the second conductive layer 340, and the photoelectric conversion layer 320, respectively, and thus detailed descriptions of the first conductive layer 310, the second conductive layer 340, and the photoelectric conversion layer 320 are omitted.

Figure 4:
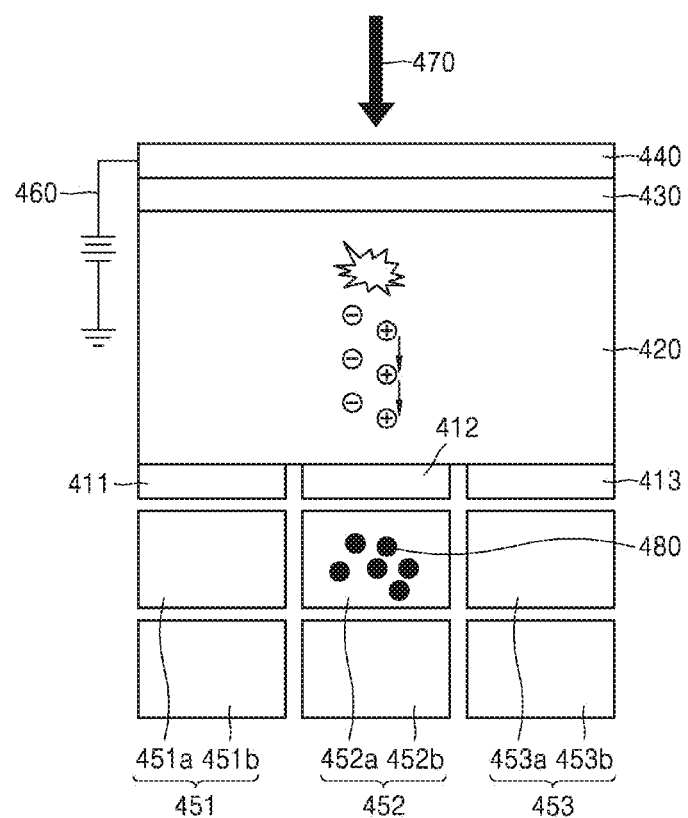
FIG. 4 is a schematic view for describing a method of operating a photoelectric conversion device according to an example embodiment.

FIG. 4 is a schematic view describing a method of operating a photoelectric conversion device according to an example embodiment in a flat imaging device. However, example embodiments are not limited thereto.

Referring to FIG. 4, a photoelectric conversion device according to an example embodiment may include first conductive layers 411, 412, and 413, a second conductive layer 440, a photoelectric conversion layer 420 and a hole blocking layer 430 between the first conductive layers 411, 412, and 413 and the second conductive layer 440.

The hole blocking layer 430 may be between the second conductive layer 440 and the photoelectric conversion layer 420. The hole blocking layer may include a first perovskite compound represented by Formula 1.

In some example embodiments, an electric field may be applied to the first conductive layers 411, 412, and 413, which serve as a negative electrode (a negative bias), and the second conductive layer 440, which serves as a positive electrode (a positive bias).

Unless stated otherwise, the above-described descriptions of the first conductive layer 110, the second conductive layer 140, the photoelectric conversion layer 120, and the hole blocking layer 130 apply respectively to the first conductive layers 411, 412, and 413, the second conductive layer 440, the photoelectric conversion layer 420, and the hole blocking layer 430, and thus detailed descriptions thereof will not be provided.

The second conductive layer 440 may be connected to a power source 460, so that an electric field may be applied to the second conductive layer 440. The opposite terminal of the power source 460 may be grounded. Accordingly, an electric field may be produced between the first conductive layers 411, 412, and 413 and the second conductive layer 440. When light 470 is incident onto the photoelectric conversion layer 420, electrons and holes are generated by the photoactive material of the photoelectric conversion layer 420. The electrons and holes are moved to the second conductive layer 440 and to the first conductive layers 411, 412, and 413, respectively, by the electric field.

The first conductive layers 411, 412, and 413 may be connected to detectors 451, 452, and 453, respectively. The first conductive layers 411, 412, and 413 may be between the detectors 451, 452, and 453, respectively, and the photoelectric conversion layer 420. That is, the detectors 451, 452, and 453 may be arranged on a bottom surface (i.e., a light exit surface) of the photoelectric conversion layer 420.

The detectors 451, 452, and 453 may detect charges 480 generated in the photoelectric conversion layer 420. The detectors 451, 452, and 453 may include storage capacitors 451a, 452a, and 453a and readout circuits 451b, 452b, and 453b, respectively. The readout circuits 451b, 452b, and 453b may read the charges 480 collected by the storage capacitors 451a, 452a, and 453a, respectively.

The readout circuits 451b, 452b, and 453b may respectively convert the amounts of charges in the storage capacitors 451a, 452a, and 453a into digital signals. The digital signals may be converted into image signals by a signal processing unit.

The second conductive layer 440, the photoelectric conversion layer 420, and the hole blocking layer 430 may be formed to cover the first conductive layers 411, 412, and 413.

Figure 5:
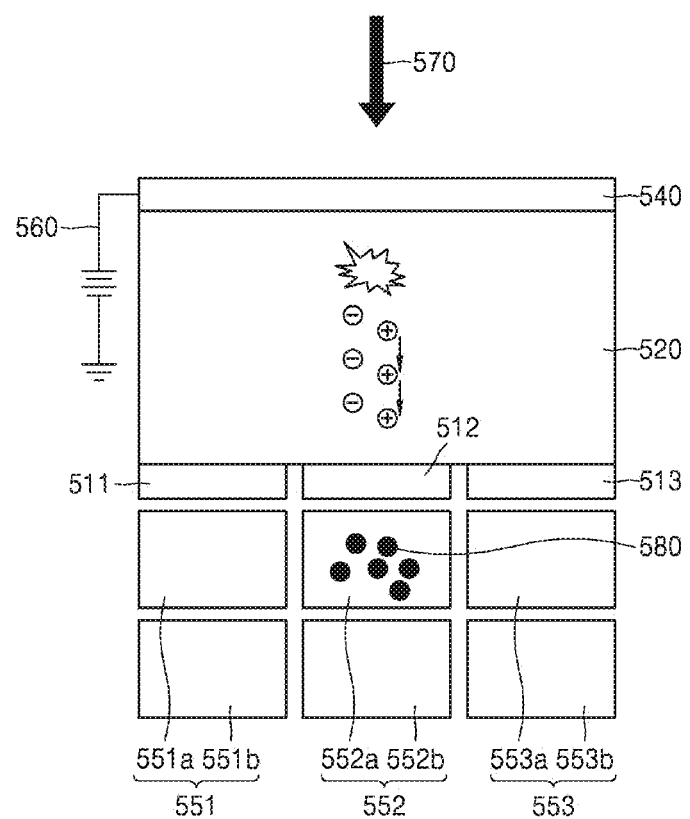
FIG. 5 is a schematic view for describing a method of operating a photoelectric conversion device according to another example embodiment.
Figure 6A:
FIGS. 6(a)-6(d) illustrate schematic cross-sectional views for describing a method of manufacturing a photoelectric conversion device according to an example embodiment.
Figure 6B:
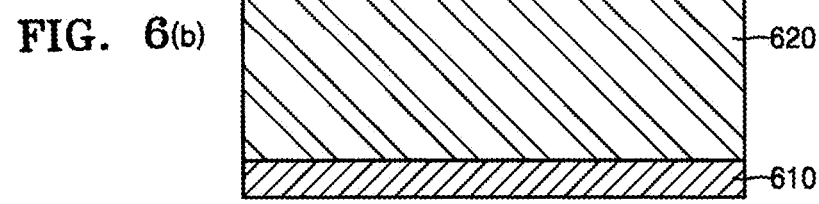
Figure 6C:
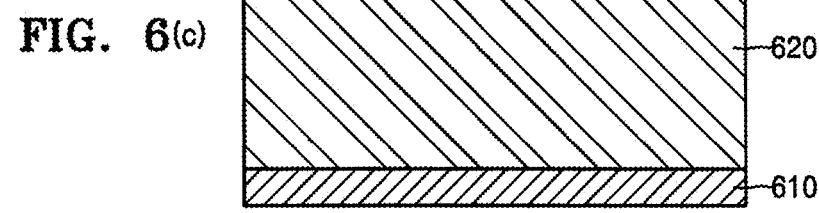
Figure 6D:
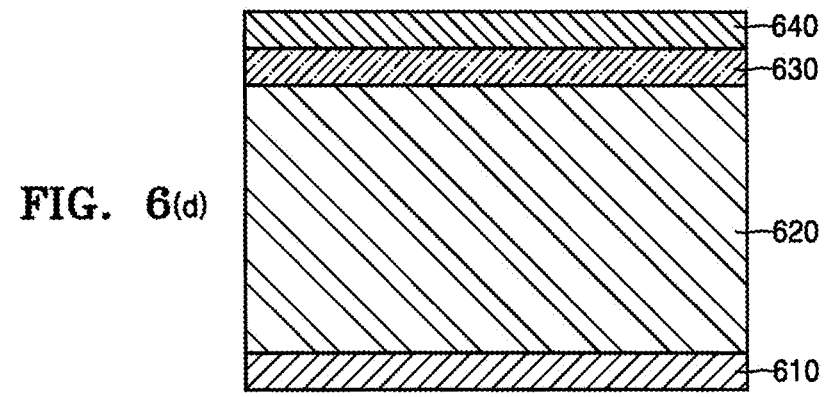

FIG. 5 is a schematic view describing a method of operating a photoelectric conversion device according to another example embodiment in a flat imaging device. However, example embodiments are not limited thereto.

Referring to FIG. 5, a photoelectric conversion device according to an example embodiment may include first conductive layers 511, 512, and 513, a second conductive layer 540, and a photoelectric conversion layer 520 between the first conductive layers 511, 512, and 513 and the second conductive layer 540.

The photoelectric conversion layer 520 may include a second perovskite compound represented by Formula 2. The second perovskite compound may be, for example, polycrystalline.

An electric field may be applied to the first conductive layers 511, 512, and 513, which may serve as a negative electrode (a negative bias), and the second conductive layer 540, which may serve as a positive electrode (a positive bias).

Unless stated otherwise, the above-described descriptions of the first conductive layers 411, 412, and 413, the second conductive layer 440, the photoelectric conversion layer 420, the detectors 451, 452, and 453, the storage capacitors 451a, 452a, and 453a, the readout circuits 451b, 452b, and 453b, the light 470, and the charges 480 will apply respectively to the first conductive layers 511, 512, and 513, the second conductive layer 540, the photoelectric conversion layer 520, detectors 551, 552, and 553, storage capacitors 551a, 552a, and 553a, readout circuits 551b, 552b, and 553b, a light 570, and charges 580 of FIG. 5, and thus detailed descriptions thereof are not provided.

FIGS. 6(a)-6(d) illustrate schematic cross-sectional views for describing a method of manufacturing a photoelectric conversion device according to an example embodiment.

A method of manufacturing a photoelectric conversion device according to an example embodiment may include providing a first conductive layer, providing a photoelectric conversion layer, providing a first mixture including a $A^1$-containing precursor, a $B^1$-containing precursor, and a solvent to form a hole blocking layer including a first perovskite compound represented by Formula 1, and providing a second conductive layer.

First, as illustrated in FIGS. 6(a)-6(d), a first conductive layer 610 may be provided. The first conductive layer 610 may be the same as the first conductive layer 110 described above with reference to FIG. 1. The first conductive layer 610 may be provided by any of a variety of methods known in the art, and thus, a detailed description thereof is omitted.

Next, a photoelectric conversion layer 620 may be provided on the first conductive layer 610. The photoelectric conversion layer 620 may be the same as the photoelectric conversion layer 120 described with reference to FIG. 1. The photoelectric conversion layer 620 may be provided using any of a variety of methods known in the art, and thus, a detailed description thereof is omitted.

Next, a hole blocking layer 630 may be provided on the photoelectric conversion layer 620. The hole blocking layer 630 may include a first perovskite compound represented by Formula 1. The first perovskite compound represented by Formula 1 may be obtained from a first mixture including an $A^1$-containing precursor, a $B^1$-containing precursor, and a solvent.

For example, the first mixture may be spin-coated on the photoelectric conversion layer 620. When the first mixture is applied onto the photoelectric conversion layer 620 by spin coating, the spin coating may be performed at, for example, a coating rate of about 2,000 rpm to about 4,000 rpm and a temperature of about 80° C. to about 200° C. Appropriate spin coating conditions may be chosen within these spin coating conditions in consideration of the composition of the first mixture and the structure of the hole blocking layer 630.

The first mixture may be applied onto the photoelectric conversion layer 620 by using any of a variety of methods known in the art.

The first mixture applied onto the hole blocking layer 630 may be thermally treated to form the hole blocking layer 630.

For example, the thermal treatment may be performed, for example, for about 15 minutes to about 2 hours at a temperature of about 100° C. to about 200° C. Appropriate thermal treatment conditions may be chosen within these thermal treatment conditions in consideration of the composition of the first mixture and the structure of the hole blocking layer 630.

In the $A^1$-containing precursor and the $B^1$-containing precursor, $A^1$ and $B^1$ may be the same as discussed above in connection with Formula 1.

For example, the $A^1$-containing precursor may be selected from, or include, halides of $A^1$ (for example, $(A^1)(X^1)$), and the $B^1$-containing precursor may be selected from, or include, halides of $B^1$ (for example, $(B^1)(Y^1)_2$). In the $(A^1)(X^1)$ and $(B^1)(Y^1)_2$, $A^1$, $B^1$, $X^1$, and $Y^1$ may be the same as discussed above in connection with Formula 1.

The solvent may be selected from, or include, the materials in which the $A^1$-containing precursor and the $B^1$-containing precursor have high solubility. For example, the solvent may be or include dimethylformamide, dimethyl sulfoxide, γ-butyrolactone, N-methyl-2-pyrrolidone, or any combination thereof. However, example embodiments are not limited thereto.

Next, the second conductive layer 640 may be provided onto the hole blocking layer 630. The second conductive layer 640 may be the same as the second conductive layer 140 described above with reference to FIG. 1. The second conductive layer 640 may be provided by any of a variety of methods known in the art, and thus, a detailed description thereof is omitted.

Figure 7:
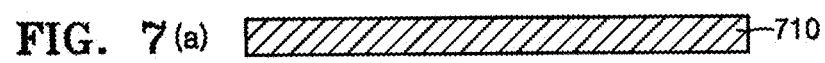
FIGS. 7(a)-7(c) illustrate schematic cross-sectional views for describing a method of manufacturing a photoelectric conversion device according to another example embodiment.
Figure 7:
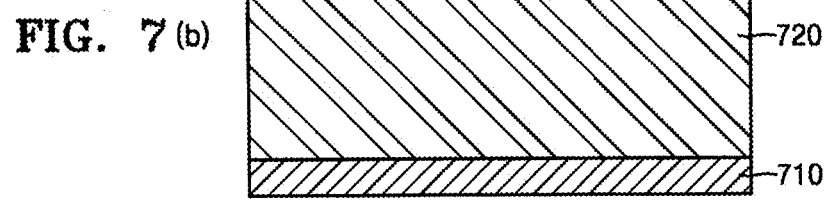
Figure 7:
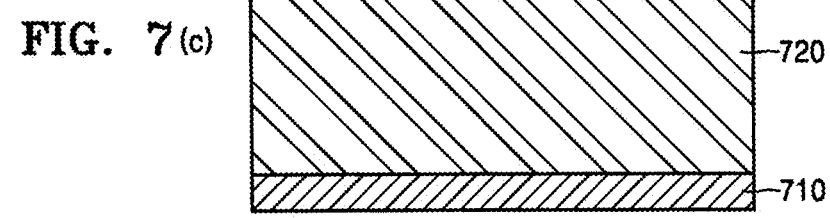

FIGS. 7(a)-7(c) illustrate schematic cross-sectional views for describing a method of manufacturing a photoelectric conversion device according to another example embodiment.

In an example embodiment, a method of manufacturing a photoelectric conversion device may include providing a first conductive layer, providing a photoelectric conversion layer including a second perovskite compound represented by Formula 2, and providing a second conductive layer, wherein the providing of the photoelectric conversion layer may include providing a second mixture including a $A^2$-containing precursor, a $B^2$-containing precursor, and a solvent; and adding a non-solvent to the second mixture to provide a third mixture.

First, as illustrated in FIGS. 7(a)-7(c), a first conductive layer 710 may be provided. The first conductive layer 710 may be the same as the first conductive layer 110 described above with reference to FIG. 1. The first conductive layer 710 may be provided by any of a variety of methods known in the art, and thus, a detailed description thereof is omitted.

Next, a photoelectric conversion layer 720 may be provided on the first conductive layer 710. The photoelectric conversion layer 720 may include a second perovskite compound represented by Formula 2. The second perovskite compound represented by Formula 2 may be obtained by providing a second mixture including a $A^2$-containing precursor, a $B^2$-containing precursor, and a solvent, and then adding a non-solvent to the second mixture to provide a third mixture.

For example, the $A^2$-containing precursor may be selected from, or include, halides of $A^2$ (for example, $(A^2)(X^2)$), and the $B^2$-containing precursor may be selected from, or include, halides of $B^2$ (for example, $(B^2)(Y^2)_2$) In the $(A^2)(X^2)$ and $(B^2)(Y^2)_2$, $A^2$, $B^2$, $X^2$, and $Y^2$ may be the same as discussed above in connection with Formula 2.

The solvent may be selected from, or include, materials in which the $A^2$-containing precursor and the $B^2$-containing precursor have high solubility. For example, the solvent may be or include dimethylformamide, dimethyl sulfoxide, γ-butyrolactone, or any combination thereof. However, example embodiments are not limited thereto.

The non-solvent may be selected from, or include, materials in which the $A^2$-containing precursor and the $B^2$-containing precursor have low solubility. For example, the non-solvent may be or include α-terpineol. However, example embodiments are not limited thereto.

For example, the third mixture may be bar-coated on the first conductive layer 710. The third mixture may have increased viscosity due to the addition of the non-solvent, and thus may be applied by bar coating. When the third mixture is applied onto the first conductive layer 710 by bar coating, the bar coating may be performed at a temperature of about 80° C. to about 200° C. Appropriate bar coating conditions may be chosen within this temperature range in consideration of the composition of the third mixture and the structure of the photoelectric conversion layer 720.

The third mixture may be applied onto the first conductive layer 710 by using any of a variety of methods known in the art.

The third mixture applied onto the first conductive layer 710 may be thermally treated to form the photoelectric conversion layer 720.

For example, the thermal treatment may be performed, for example, for about 15 minutes to about 2 hours at a temperature of about 100° C. to about 200° C. Appropriate thermal treatment conditions may be chosen within these thermal treatment conditions in consideration of the composition of the third mixture and the structure of the photoelectric conversion layer 720.

Optionally, after the third mixture is applied onto the first conductive layer 710 to form a preliminary photoelectric conversion layer including the second perovskite compound represented by Formula 2, the preliminary photoelectric conversion layer may be pressed at a high temperature (for example, in a temperature range of about 100° C. to about 200° C.) under high pressure (for example, in an atmospheric pressure range of about 5 atm to about 10 atm) to obtain the photoelectric conversion layer. Optionally, during this process the $A^2$-containing precursor may be further supplied in a gas phase. In this case, the second perovskite compound represented by Formula 2 may be polycrystalline.

Next, the second conductive layer 740 may be provided on the photoelectric conversion layer 720. The second conductive layer 740 may be the same as the second conductive layer 140 described above with reference to FIG. 1. The second conductive layer 740 may be provided by any of a variety of methods known in the art, and thus, a detailed description thereof is omitted.

A photoelectric conversion device according to any of the above-described example embodiments may be included in an imaging device. The imaging device may be a stationary or mobile imaging device.

The imaging device may include a light irradiation unit, a photodetector unit, and a control unit.

The light irradiation unit may include a light source which generates light, and a collimator which guides a path of the generated light to control a light irradiation region.

The light source may include, for example, an X-ray tube. The X-ray tube may be implemented as a bipolar vacuum tube consisting of a cathode and an anode. A voltage applied between the cathode and the anode of the X-ray tube is referred to as a tube voltage, wherein the maximum tube voltage is expressed in peak kilovoltage (kVp). An increased tube voltage leads to an increased rate of thermoelectrons, which consequently leads to increased X-ray energy (photon energy) from collision of thermoelectrons against a target material. A current which flows in the X-ray tube is referred to as a tube current, and an average tube current is expressed in mA. An increased tube current leads to an increased number of thermoelectrons emitted from the filament, which consequently leads to an increased X-ray dose (number of X-ray photons) from collision of thermoelectrons against a target material. Thus, X-ray energy may be controlled by the tube voltage, and the X-ray intensity or dose may be controlled by the tube current and an X-ray exposure time.

The photodetector unit may detect light passing through an object after emission from the light irradiation unit. For example, the photodetector unit may include a flat photodetector. The photodetector unit may include the photoelectric conversion device 100 and/or the photoelectric conversion device 300 described above with reference to FIGS. 1 and 3, respectively.

The control unit may include a voltage generating unit, a signal processing unit, and an operating unit, and may control the overall operation of the imaging device.

The voltage generator may generate a high voltage for light emission and apply the voltage to the light source of the light irradiation unit.

The signal processing unit may generate an image by processing information detected by the photodetector unit or may generate a control signal based on information input to the operating unit to control the components of the imaging device.

The operating unit, which may provide an interface for operating the imaging device, may receive various types of information, regarding operation commands of the image device or imaging, from a user.

The imaging device may further include an output unit. The output unit may display imaging-related information such as light irradiation or may display an image generated by the signal processing unit.

One or more example embodiments will now be described in detail with reference to the following examples. However, these examples are only for illustrative purposes and are not intended to limit the scope of the one or more example embodiments. In the following preparation examples, the expression that "'B' was used, instead of 'A'" means that the amounts of 'B' and 'A' were the same in equivalent amounts.

EXAMPLE

Preparation Example 1: Preparation of Mixture A $CH_3NH_3Br$, $PbBr_2$, dimethylformamide, and dimethyl sulfoxide were added to a reactor at a molar ratio of about 1:1:6.76:2 and stirred for about 1 hour to prepare a mixture A.

Preparation Example 2: Preparation of Mixture C (1) Preparation of Mixture B
$CH_3NH_3I$, $PbI_2$, and γ-butyrolactone, at a molar ratio of about 1:1:2.5, were stirred in a reactor at about 80° C. overnight to prepare a mixture B.
(2) Preparation of Mixture C
α-terpineol was further added to the mixture B at about 30 wt % relative to the γ-butyrolactone included in the mixture B and stirred at about 80° C. overnight to prepare a mixture C.

Comparative Preparation Example 1: Preparation of Mixture X (1) Preparation of Mixture B $CH_3NH_3I$, $PbI_2$, and γ-butyrolactone, at a molar ratio of about 1:1:2.5, were stirred in a reactor at about 80° C. overnight to prepare a mixture B.

(2) Preparation of Mixture X

α-terpineol was further added to the mixture B at about 30 wt % relative to the γ-butyrolactone included in the mixture B and stirred at about 80° C. overnight to prepare a mixture X.

Example 1

(1) Formation of First Substrate

A first conductive layer having a thickness of about 200 nm was formed by sputtering amorphous ITO against a glass substrate.

The mixture C was bar-coated on the first conductive layer to a thickness of about 410±20 μm, thermally treated at about 120° C. for about 1 hour, and then thermally treated in a vacuum oven at about 90° C. for about 1 hour, thereby forming a preliminary photoelectric conversion layer. The preliminary photoelectric conversion layer was pressed under 5 atm at about 120° C. to form a photoelectric conversion layer having a thickness of about 400±5 μm, thereby forming a first substrate.

(2) Formation of Second Substrate

A second conductive layer having a thickness of about 200 nm was formed by sputtering amorphous ITO against a glass substrate.

The mixture A was spin-coated on the second conductive layer at about 2000 rpm for about 30 seconds, while about 2 mL of diethyl ether was dropwise added each second for about 20 seconds, starting from about 10 seconds after the start of the spin coating, followed by heat treatment at about 100° C. for about 10 minutes to form a hole blocking layer having a thickness of about 700 nm including $CH_3NH_3PbBr_3$, thereby forming a second substrate.

(3) Manufacture of Photoelectric Conversion Device

A photoelectric conversion device was manufactured by combining the second substrate onto the first substrate, the photoelectric conversion device having a structure of glass substrate/ITO/hole blocking layer/photoelectric conversion layer/ITO/glass substrate.

Comparative Example 1

A photoelectric conversion device was manufactured in the same manner as in Example 1, except that a polyimide hole blocking layer having a thickness of about 10 μm was used.

Evaluation Example 1

Current densities of the photoelectric conversion devices of Example 1 and Comparative Example 1 were measured at different voltages. The measurement of the current densities was repeated under the same conditions with and without external light irradiation ("Photo" and "Dark" conditions, respectively). The results of the photoelectric conversion devices of Example 1 and Comparative Example 1 are shown in FIGS. 8 and 9, respectively.

Figure 8:
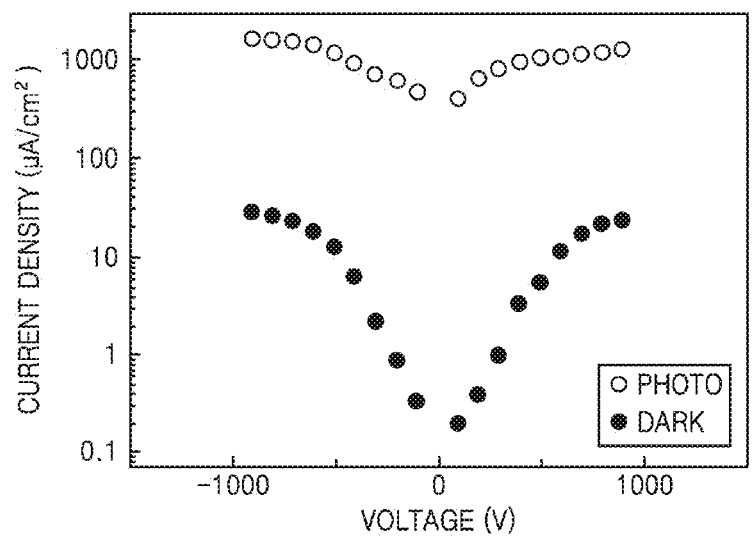
FIG. 8 is a graph of current density with respect to voltage, illustrating experimental results for an example photoelectric conversion device.
Figure 9:
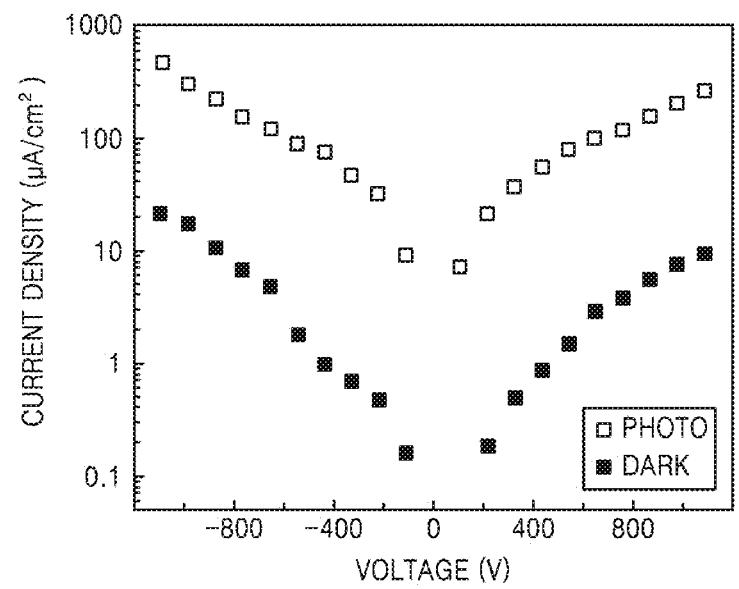
FIG. 9 is a graph of current density with respect to voltage, illustrating experimental results for a photoelectric conversion device.

Referring to FIGS. 8 and 9, the photoelectric conversion device of Example 1 was found to have a lower dark current as compared with the photoelectric conversion device of Comparative Example 1.

Example 2

A first conductive layer having a thickness of about 200 nm was formed by sputtering amorphous ITO against a glass substrate.

The mixture C was bar-coated on the first conductive layer to a thickness of about 410±20 μm, thermally treated at about 120° C. for about 1 hour, and then thermally treated in a vacuum oven at about 90° C. for about 1 hour, thereby forming a preliminary photoelectric conversion layer. The preliminary photoelectric conversion layer was pressed under 5 atm at about 120° C. to form a photoelectric conversion layer having a thickness of about 400±5 μm.

A glass substrate with a 200 nm-thick second conductive layer formed by spurring amorphous ITO against the glass substrate was combined onto the photoelectric conversion layer, thereby manufacturing a photoelectric conversion device.

A scanning electron microscope (SEM) image of the photoelectric conversion layer of the photoelectric conversion device of Example 2 is shown in FIG. 13.

Comparative Example 2

A photoelectric conversion device was manufactured in the same manner as in Example 2, except that the mixture X was used, instead of the mixture C, to form the photoelectric conversion layer.

Figure 14:
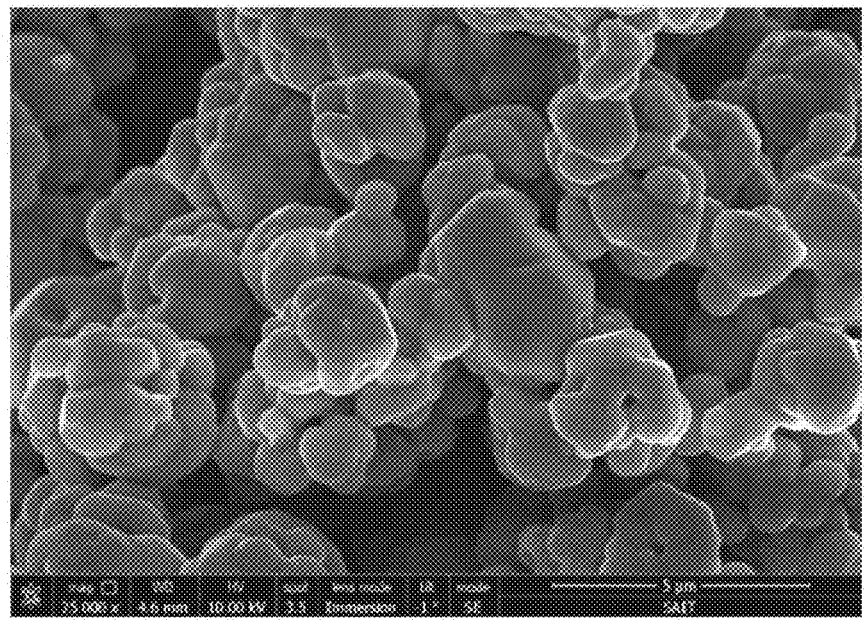
FIG. 14 is an SEM image of a photoelectric conversion layer of a photoelectric conversion device.

An SEM image of the photoelectric conversion layer of the photoelectric conversion device of Comparative Example 2 is shown in FIG. 14.

Evaluation Example 2

Current densities of the photoelectric conversion devices of Example 2 and Comparative Example 2 were measured at different voltages. The measurement of the current densities was repeated under the same conditions with and without external light irradiation ("Photo" and "Dark" conditions, respectively). The results are shown in FIG. 10.

Figure 10:
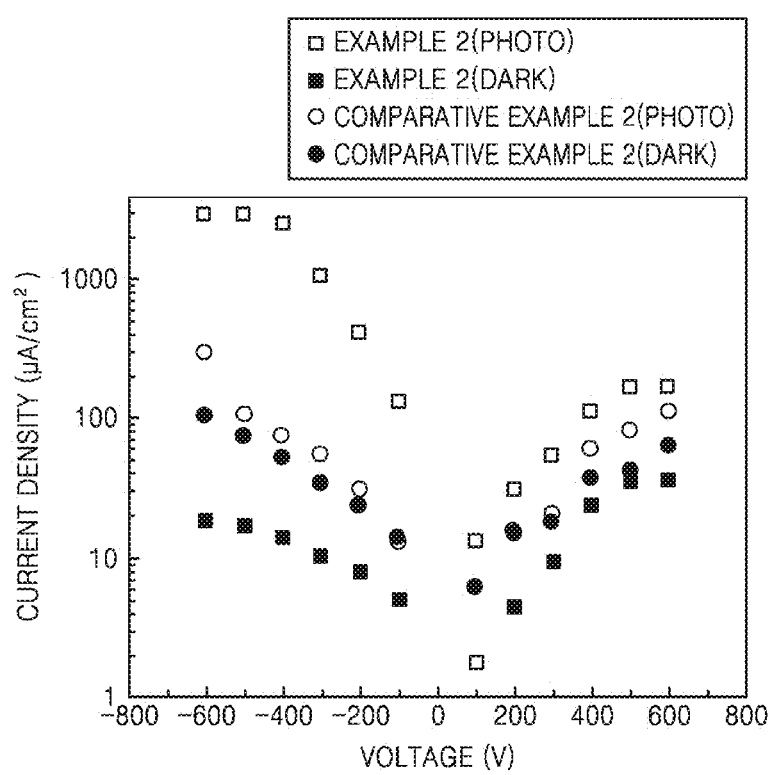
FIG. 10 is a graph of current density with respect to voltage, illustrating experimental results for example photoelectric conversion devices.

Referring to FIG. 10, the photoelectric conversion device of Example 2 was found to have a lower dark current as compared with the photoelectric conversion device of Comparative Example 2.

Evaluation Example 3

Currents of the photoelectric conversion device of Example 2 at different voltages and the photoelectric conversion device of Comparative Example 2 at a voltage of about 600V were measured with X-ray irradiation, wherein a distance between an X-ray source and the photoelectric conversion device was about 30 cm, an X-ray tube voltage was about 100 kVp, an X-ray tube current was about 20 mA, and an X-ray irradiation time was about 0.2 seconds. The results of the photoelectric conversion devices of Example 2 and Comparative Example 2 are shown in FIGS. 11 and 12, respectively.

Figure 11:
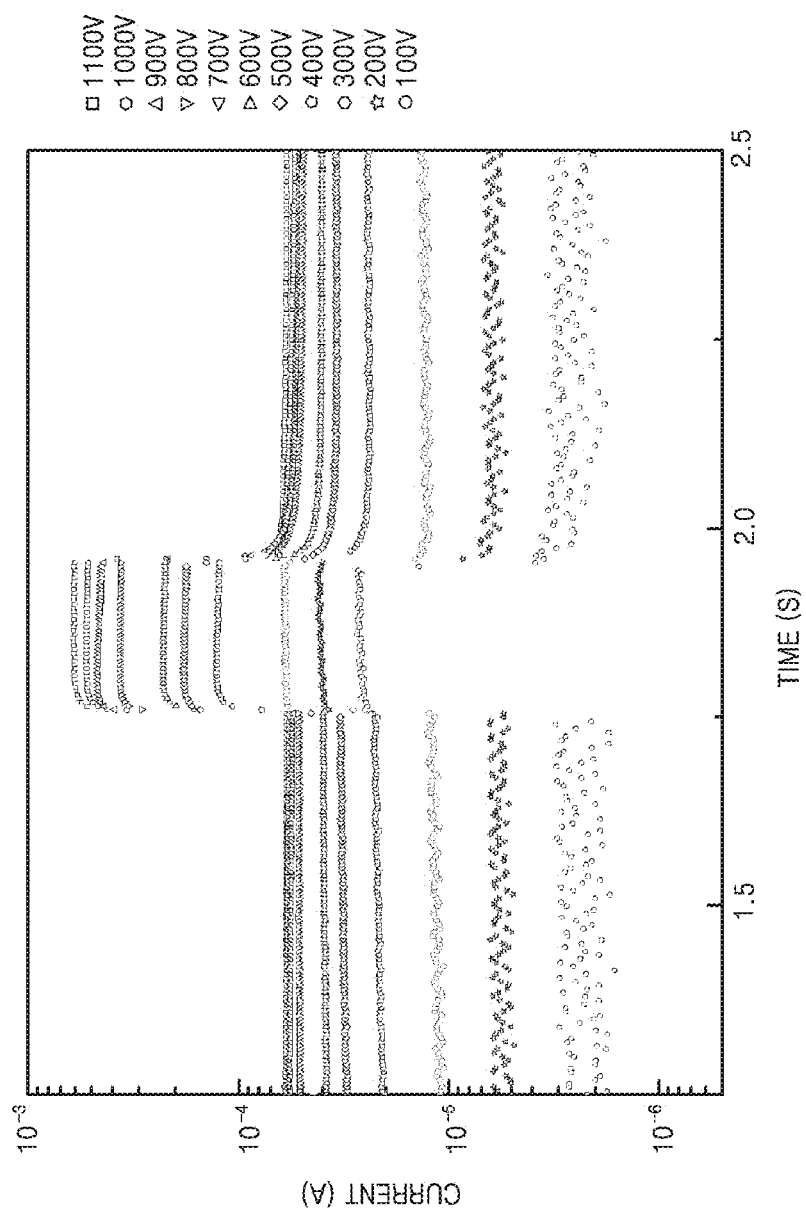
FIG. 11 is a graph of current with respect to time, illustrating experimental results for an example photoelectric conversion device.
Figure 12:
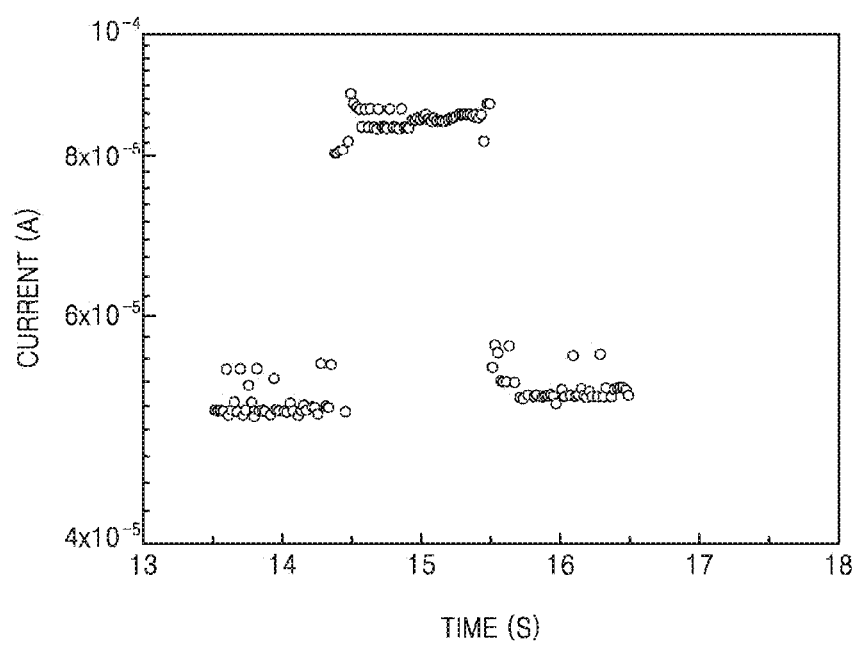
FIG. 12 is a graph of current with respect to time, illustrating experimental results for a photoelectric conversion device.

Referring to FIGS. 11 and 12, the photoelectric conversion device of Example 2 was found to have a higher sensitivity to X-rays as compared with the photoelectric conversion device of Comparative Example 2.

As described above, according to the one or more example embodiments, a photoelectric conversion device including a perovskite compound may have improved photoelectric conversion efficiency and a reduced dark current, and a high-definition imaging device may be provided by using the photoelectric conversion device.

It should be understood that example embodiments described herein should be considered in a descriptive sense only and not for purposes of limitation. Descriptions of features within each example embodiment should typically be considered as available for other similar features in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. A photoelectric conversion device comprising:
   a first conductive layer;
   a second conductive layer; and
   a photoelectric conversion layer and a hole blocking layer between the first conductive layer and the second conductive layer,
   wherein the hole blocking layer is between the second conductive layer and the photoelectric conversion layer and includes a first perovskite compound represented by Formula 1:

$[A^1][B^1][X^1_{(3-n)}Y^1_n]$   <Formula 1> wherein, in Formula 1,
   $A^1$ is at least one monovalent organic cation, at least one monovalent inorganic cation, or any combination thereof,
   $B^1$ is at least one divalent inorganic cation,
   $X^1$ and $Y^1$ are each independently at least one monovalent anion, and
   n is a real number satisfying 0≤n≤3; and
   wherein the photoelectric conversion layer includes a photoactive material, and the photoactive material has a band gap ($B_{gaDL}$) smaller than a band gap ($B_{gapP}$) of the first perovskite compound.

2. The photoelectric conversion device of claim 1, wherein $A^1$ is $(CH_3NH_3)^+$, $((CH_3CH_2CH_2CH_2)NH_3)^+$, $K^+$, $Rb^+$, $Cs^+$, or any combination thereof.

3. The photoelectric conversion device of claim 1, wherein $B^1$ is $Pb^{2+}$.

4. The photoelectric conversion device of claim 1, wherein $X^1$ and $Y^1$ are each independently selected from $Cl^-$, $Br^-$, and $I^-$.

5. The photoelectric conversion device of claim 1, wherein the first perovskite compound represented by Formula 1 is selected from $CH_3NH_3PbBr_3$, $CH_3NH_3PbBr_{(3-o)}I_o$, $CH_3NH_3PbCl_{(3-o)}Br_o$, $CH_3NH_3PbCl_{(3-o)}I_o$, $CsPbI_3$, $CsPbBr_3$, $CH_3CH_2CH_2CH_2NH_3PbBr_3$, $NH_2CHNH_2PbBr_3$, $NH_2CHNH_2PbBr_{(3-o)}I_o$, $[CH_3NH_3]_{(1-x)}[NH_2CHNH_2]_xPbBr_3$ and $[CH_3NH_3]_{(1-x)}[NH_2CHNH_2]PbBr_{(3-o)}I_o$, wherein o is a real number greater than 0 and less than 3, and x is a real number greater than 0 and less than 1.

6. The photoelectric conversion device of claim 1, wherein the hole blocking layer has a thickness of about 1 nm to about 10 μm.

7. The photoelectric conversion device of claim 1, wherein the second conductive layer is reflective, transmissive, or semi-transmissive.

8. The photoelectric conversion device of claim 1, wherein the photoelectric conversion layer comprises a second perovskite compound represented by Formula 2:

$[A^2][B^2][X^2_{(3-m)}Y^2_m]$   <Formula 2> wherein, in Formula 2,
$A^2$ is at least one monovalent organic cation, at least one monovalent inorganic cation, or any combination thereof,
$B^2$ is at least one divalent inorganic cation,
$X^2$ and $Y^2$ are each independently at least one monovalent anion, and
m is a real number satisfying 0 ≤ m ≤ 3.

9. The photoelectric conversion device of claim 1, wherein the photoelectric conversion layer is configured to absorb infrared rays, visible rays, or X-rays.

10. The photoelectric conversion device of claim 1, wherein the photoelectric conversion layer has a thickness of about 0.1 μm to about 2000 μm.

11. The photoelectric conversion device of claim 1, wherein the photoelectric conversion layer includes a second perovskite compound represented by Formula 2, and the second perovskite compound is polycrystalline:

$[A^2][B^2][X^2_{(3-m)}Y^2_m]$   <Formula 2> wherein, in Formula 2,
$A^2$ is at least one monovalent organic cation, a monovalent inorganic cation, or any combination thereof,
$B^2$ is at least one divalent inorganic cation,
$X^2$ and $Y^2$ are each independently at least one monovalent anion, and
m is a real number satisfying 0≤m≤3.

12. The photoelectric conversion device of claim 11, wherein the second perovskite compound represented by Formula 2 has a structure in which crystals are fused to each other.

13. The photoelectric conversion device of claim 11, wherein a longest crystal axis of the second perovskite compound represented by Formula 2 has a length of about 1 μm to about 300 μm.

14. The photoelectric conversion device of claim 11, wherein the second perovskite compound represented by Formula 2 is $CH_3NH_3PbI_3$.

15. The photoelectric conversion device of claim 11, wherein the photoelectric conversion layer is configured to absorb infrared rays, visible rays, or X-rays.

16. The photoelectric conversion device of claim 11, wherein the photoelectric conversion layer has a thickness of about 0.1 μm to about 2000 μm.

17. The photoelectric conversion device of claim 11, wherein the second conductive layer is reflective, transmissive, or semi-transmissive.

18. An imaging device comprising a light irradiation unit, a photodetector unit, and a control unit, the photodetector unit including the photoelectric conversion device of claim 1.

* * * * *